US008513945B2

(12) United States Patent
Kim et al.

(10) Patent No.: US 8,513,945 B2
(45) Date of Patent: Aug. 20, 2013

(54) SYSTEM, METHOD AND COMPUTER-ACCESSIBLE MEDIUM FOR PROVIDING BREATH-HOLD MULTI-ECHO FAST SPIN-ECHO PULSE SEQUENCE FOR ACCURATE $R_2$ MEASUREMENT

(75) Inventors: Daniel Kim, Hackensack, NJ (US); Jens H. Jensen, Scarsdale, NY (US); Gary M. Brittenham, New York, NY (US)

(73) Assignees: New York University, New York, NY (US); The Trustees of Columbia University in the City of New York, New York, NY (US)

( * ) Notice: Subject to any disclaimer, the term of this patent is extended or adjusted under 35 U.S.C. 154(b) by 571 days.

(21) Appl. No.: 12/754,485

(22) Filed: Apr. 5, 2010

(65) Prior Publication Data

US 2010/0301860 A1 Dec. 2, 2010

Related U.S. Application Data

(60) Provisional application No. 61/166,640, filed on Apr. 3, 2009.

(51) Int. Cl.
*G01V 3/00* (2006.01)

(52) U.S. Cl.
USPC .......................................... 324/309

(58) Field of Classification Search
USPC ................................. 324/300–322
See application file for complete search history.

(56) References Cited

U.S. PATENT DOCUMENTS

| | | | | |
|---|---|---|---|---|
| 6,486,667 B1 * | 11/2002 | Wu et al. | | 324/306 |
| 7,265,547 B2 * | 9/2007 | Vu | | 324/309 |
| 7,706,855 B1 * | 4/2010 | Priatna et al. | | 600/410 |

OTHER PUBLICATIONS

E. Alexopoulou et al. "R2 relaxometry with MRI for the quantification of tissue iron overload in beta-thalassemic patients," Journal of Mag. Res. Imaging 2006; 23(2);163-170.

H. Gouya et al. "Rapidly reversible myocardial edema in patients with acromegaly: assessment with ultrafast T2 mapping in a single-breath-hold MRI sequence," American Journal of Roentgenology 2008; 190 (6):1576-1582.

M. Griswold et al. "Generalized autocalibrating partially parallel acquisitions (GRAPPA)," Magnetic Resonance in Medicine 2002; 47 (6):1202-1210.

T. He et al. "Multi-center transferability of a breath-hold T2 technique for myocardial iron assessment," Journal of Cardiovascular Magnetic Resonance 2008; 10 (1):11.

J. Hennig et al. "RARE imaging: a fast imaging method for clinical MR," Magnetic Resonance in Medicine 1986; 3 (6):823-833.

Teng-Yi et al. "T2 measurement of the human myocardium using a T2-prepared transient-state TrueFISP sequence," Magnetic Resonance in Medicine 2007; 57 (5):960-966.

(Continued)

*Primary Examiner* — Dixomara Vargas
(74) *Attorney, Agent, or Firm* — Dorsey & Whitney LLP

(57) ABSTRACT

Exemplary embodiments of system, method and computer-accessible medium can be provided in accordance with the present disclosure can be provided for generating a plurality of images associated with at least one anatomical structure using magnetic resonance imaging (MRI) data. For example, using such exemplary embodiments, it is possible to obtain at least one multi-echo fast spin-echo (FSE) pulse sequence based on the MRI data, which can include, e.g., hardware specifications of the MRI system. Further, it is possible to generate each of the images based on a particular arrangement of multiple echoes produced by the multi-echo FSE pulse sequence(s).

24 Claims, 9 Drawing Sheets

(56) References Cited

OTHER PUBLICATIONS

P. Kellman et al. "Adaptive sensitivity encoding incorporating temporal filtering (TSENSE)," Magnetic Resonance in Medicine 2001; 45 (5):846-852.

Wynnie et al. "One-stop measurement of iron deposition in the anterior pituitary, liver, and heart in thalassemia patients," Journal of Magnetic Resonance Imaging 2008; 28 (1):29-33.

M. Lustig et al. "The application of compressed sensing for rapid MR imaging," Magnetic Resonance in Medicine 2007; 58 (6):1182-1195.

S. Meiboom S et al. "Modified spin-echo method for measuring nuclear relaxation times," The Review of Scientific Instruments 1958; 29 (8):688-691.

G. Pell et al. "Optimized clinical T2 relaxometry with a standard CPMG sequence," Journal of Magnetic Resonance Imaging 2006; 23 (2):248-252.

M. Sekiguchi et al. "Histopathologic and ultrastructural observations of acute and convalescent myocarditis: a serial endomyocardial biopsy study," Heart & Vessels—Supplement 1985; 1:143-153.

T. St Pierre et al. "Single spin-echo proton transverse relaxometry of iron-loaded liver," NMR in Biomedicine 2004; 17 (7):446-458.

T. St Pierre et al. "Noninvasive measurement and imaging of liver iron concentrations using proton magnetic resonance," Blood 2005; 105(2):855-861.

J. Ulmer et al. "Magnetization transfer or spin-lock? An investigation of off-resonance saturation pulse imaging with varying frequency offsets," American Journal of Neuroradiology 1996; 17 (5):805-819.

E. Voskaridou et al. "Magnetic resonance imaging in the evaluation of iron overload in patients with beta thalassaemia and sickle cell disease," British Journal of Haematology 2004; 126 (5):736-742.

J. Willerson et al. "Abnormal myocardial fluid retention as an early manifestation of ischemic injury," American Journal of Pathology 1977; 87 (1):159-188.

J. Wood et al. "MRI R2 and R2* mapping accurately estimates hepatic iron concentration in transfusion-dependent thalassemia and sickle cell disease patients," Blood 2005; 106(4):1460-1465.

S. Sen-Chowdhry et al. "Arrhythmogenic right ventricular cardiomyopathy with fibrofatty atrophy, myocardial oedema, and aneurysmal dilation," Heart 2005; 91(6):784.

H. Carr et al. "Effects of diffusion on free precession in nuclear magnetic resonance experiments," Physical Review 1954; 94 (3):630-638.

C. Higgins et al. "Nuclear magnetic resonance imaging of acute myocardial infarction in dogs: alterations in magnetic relaxation times," American Journal of Cardiology 1983; 52 (1):184-188.

Leoffler R et al. "Breath-hold technique for R2 quantification utilizing echo sharing for efficient sampling," In: Proceedings of the 15th Annual Meeting of ISMRM, Berlin, Germany, 2007.

He T et al., "Development of a novel optimized breathhold technique for myocardial T2 measurement in thalassemia," Journal of Magnetic Resonance Imaging 2006; 24 (3):580-585.

Constable R T et al. "The loss of small objects in variable TE imaging: implications for FSE, RARE, and EPI," Magnetic Resonance in Medicine 1992; 28 (1):9-24.

Vymazal J. et al. "T1 and T2 of ferritin solutions: effect of loading factor," Magnetic Resonance in Medicine 1996; 36 (1):61-65.

Li W et al. "Differentiation between hemangiomas and cysts of the liver with nonenhanced MR imaging: efficacy of T2 values at 1.5 T," Journal of Magnetic Resonance Imaging 1993:800-802.

Ohtomo K et al., Hepatocellular carcinoma and cavernous hemangioma: differentiation with MR imaging. Efficacy of T2 values at 0.35 and 1.5 T, Radiology 1988; 168 (3):621-623.

McFarland E G et al., Hepatic hemangiomas and malignant tumors: improved differentiation with heavily T2-weighted conventional spin-echo MR imaging, Radiology 1994; 193 (1):43-47.

Ito K et al., Hepatic lesions: discrimination of nonsolid, benign lesions from solid, malignant lesions with heavily T2-weighted fast spin-echo MR imaging, Radiology 1997; 204 (3):729-737.

Rydberg J N et al., Comparison of breath-hold fast spin-echo and conventional spin-echo pulse sequences for T2-weighted MR imaging of liver lesions, Radiology 1995; 194 (2):431-437.

Simonetti O P et al., "Black blood" T2-weighted inversion-recovery MR imaging of the heart, Radiology 1996; 199 (1):49-57.

Kucharczyk W et al., MR technology: effect of even-echo rephasing on calculated T2 values and T2 images, Radiology 1985; 157 (1):95-101.

Sasaguri S et al., Early detection of cardiac allograft rejection with proton nuclear magnetic resonance, Circulation 1985; 72 (3 Pt 2):II231-236.

* cited by examiner

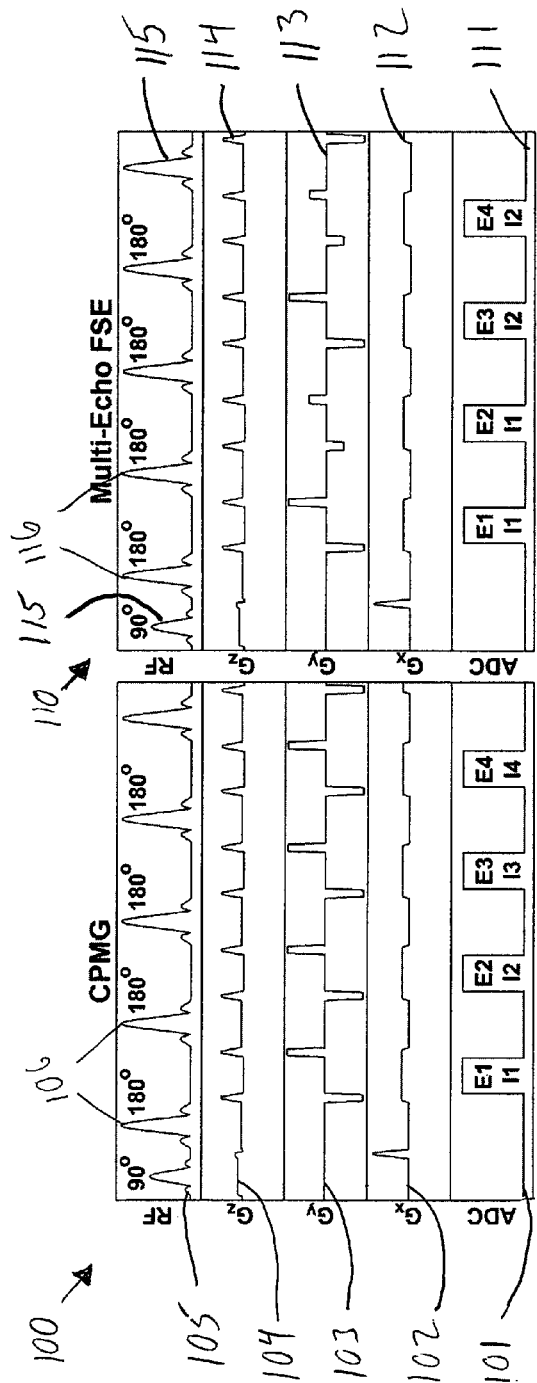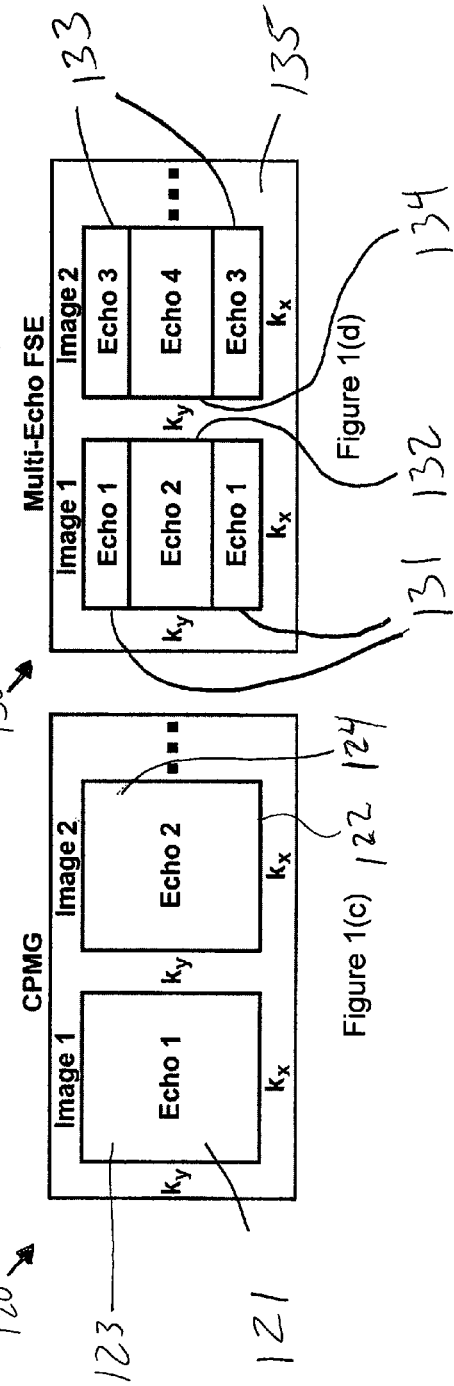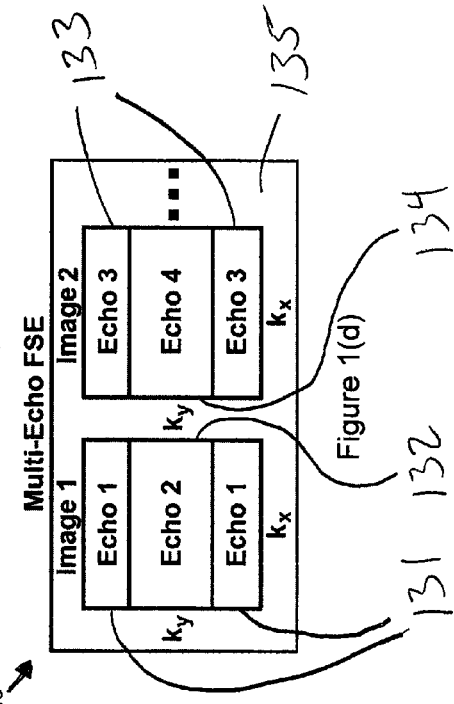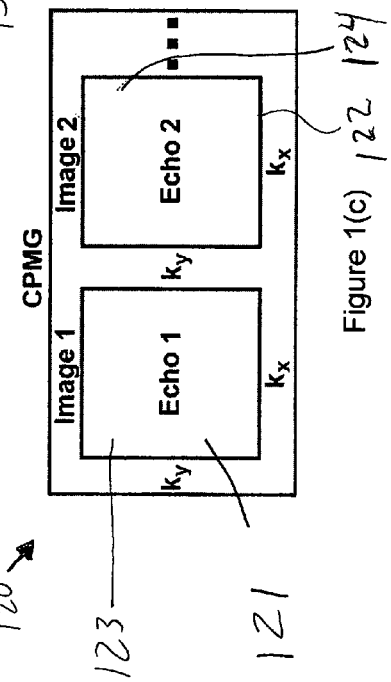

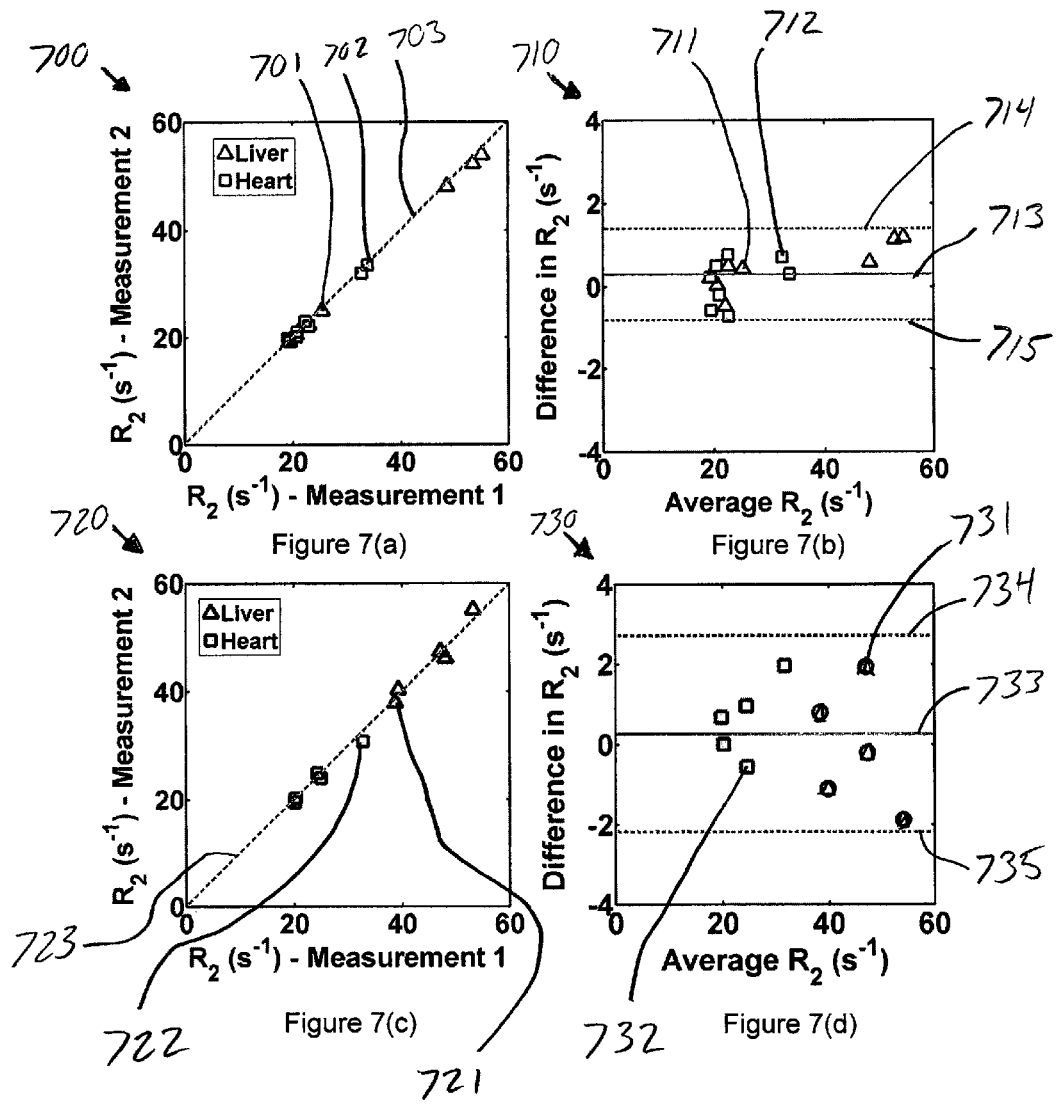

SYSTEM, METHOD AND COMPUTER-ACCESSIBLE MEDIUM FOR PROVIDING BREATH-HOLD MULTI-ECHO FAST SPIN-ECHO PULSE SEQUENCE FOR ACCURATE $R_2$ MEASUREMENT

CROSS-REFERENCE TO RELATED APPLICATION(S)

The present application relates to and claims priority from U.S. Patent Application No. 61/166,640 filed Apr. 3, 2009, the entire disclosure of which is hereby incorporated herein by reference.

STATEMENT REGARDING GOVERNMENT SPONSORED RESEARCH

The invention was made with U.S. Government support, at least in part, by the National Institutes of Health, Grant numbers R01-DK069373 and R01-DK066251; and with the support of the American Heart Association, Grant number 0730143N. Thus, the U.S. Government may have certain rights to the disclosure.

FIELD OF THE DISCLOSURE

The present disclosure relates generally to exemplary embodiments of systems, apparatus and methods which facilitate magnetic resonance imaging, and more particularly to exemplary embodiments of a system, apparatus, method and computer accessible medium for providing a multi-echo fast spin echo pulse sequence for accurate transverse relaxation rate ($R_2$) measurement of an anatomical structure.

BACKGROUND INFORMATION

For example, $T_2$-weighted MRI can be used to differentiate between normal and diseased tissue in clinical studies of, e.g., the liver (see, e.g., Ohtomo K et al., *Hepatocellular carcinoma and cavernous hemangioma: differentiation with MR imaging. Efficacy of T2 values at 0.35 and 1.5 T*, Radiology 1988; 168 (3):621-623; Li W et al., *Differentiation between hemangiomas and cysts of the liver with nonenhanced MR imaging: efficacy of T2 values at 1.5 T*, Journal of Magnetic Resonance Imaging 1993;800-802; McFarland E G et al., *Hepatic hemangiomas and malignant tumors: improved differentiation with heavily T2-weighted conventional spin-echo MR imaging*, Radiology 1994; 193 (1):43-47; Ito K et al., *Hepatic lesions: discrimination of nonsolid, benign lesions from solid, malignant lesions with heavily T2-weighted fast spin-echo MR imaging*, Radiology 1997; 204 (3):729-737) and heart (see, e.g., Willerson J T et al., *Abnormal myocardial fluid retention as an early manifestation of ischemic injury*, American Journal of Pathology 1977; 87 (1):159-188; Higgins C B et al., *Nuclear magnetic resonance imaging of acute myocardial infarction in dogs: alterations in magnetic relaxation times*, American Journal of Cardiology 1983; 52 (1): 184-188; Sekiguchi M et al., *Histopathologic and ultrastructural observations of acute and convalescent myocarditis: a serial endomyocardial biopsy study*, Heart & Vessels— Supplement 1985; 1:143-153; Sen-Chowdhry S et al., *Arrhythmogenic right ventricular cardiomyopathy with fibrofatty atrophy, myocardial oedema, and aneurysmal dilation*, Heart 2005; 91(6):784), as well as the brain and other organs. A widely exploited image contrast mechanism and/or process can include an alteration of water content by disease, with edematous tissue exhibiting a higher $T_2$-weighted signal than normal tissue. Iron accumulation can provide another contrast mechanism/process, with excess iron resulting in a lower $T_2$-weighted signal than normal tissue. Generally, a breath-hold fast spin-echo (FSE) pulse sequence (see, e.g., Hennig J et al., *RARE imaging: a fast imaging method for clinical MR*, Magnetic Resonance in Medicine 1986; 3 (6): 823-833) has been used for clinical hepatic and myocardial $T_2$-weighted MRI due to its higher data acquisition efficiency, as compared to a single spin-echo pulse sequence (see, e.g., Rydberg J N et al., *Comparison of breath-hold fast spin-echo and conventional spin-echo pulse sequences for T2-weighted MR imaging of liver lesions*, Radiology 1995; 194 (2):431-437; Simonetti O P et al., *"Black blood" T2-weighted inversion-recovery MR imaging of the heart*, Radiology 1996; 199 (1):49-57).

Quantitative tissue characterization by measurement of proton transverse relaxation rates ($R_2$) can further improve the accuracy and precision of detecting pathological changes and assessing their severity. While a multiple single spin-echo pulse sequence with different echo time (TE) acquisitions may be considered as a reference technique for $R_2$ measurement, this technique can be inefficient for clinical imaging. An alternative approach can be to employ a Carr-Purcell-Meiboom-Gill (CPMG) pulse sequence (see, e.g., Carr H et al., *Effects of diffusion on free precession in nuclear magnetic resonance experiments*, Physical Review 1954; 94 (3):630-638; Meiboom S et al., *Modified spin-echo method for measuring nuclear relaxation times*, The Review of Scientific Instruments 1958; 29 (8):688-691), and accelerate the corresponding multiple single spin echo data acquisitions by the echo train length. While a CPMG sequence can reduce the total imaging time of the corresponding multiple single spin-echo acquisitions with different echo times, its data acquisition efficiency can still be relatively insufficient for breath-hold imaging of the liver or heart. Accordingly, multiple single spin-echo and CPMG pulse sequences can generally be performed during free breathing with respiratory gating (see, e.g., St Pierre T G et al., *Noninvasive measurement and imaging of liver iron concentrations using proton magnetic resonance*, Blood 2005; 105(2):855-861; Voskaridou E et al., *Magnetic resonance imaging in the evaluation of iron overload in patients with beta thalassaemia and sickle cell disease*, British Journal of Haematology 2004; 126 (5):736-742; Alexopoulou E et al., *R2 relaxometry with MRI for the quantification of tissue iron overload in beta-thalassemic patients*, Journal of Magnetic Resonance Imaging 2006; 23 (2):163-170; Wood J C et al., *MRI R2 and R2\* mapping accurately estimates hepatic iron concentration in transfusion-dependent thalassemia and sickle cell disease patients*, Blood 2005; 106(4):1460-1465), which can render them impractical for performing comprehensive assessment of the liver or heart within a clinically acceptable examination time, for example.

Different breath-hold spin-echo pulse sequences have recently been described for $R_2$ measurement in the liver (see, e.g., Leoffler R et al., *breath-hold technique for R2 quantification utilizing echo sharing for efficient sampling*, In: Proceedings of the 15th Annual Meeting of ISMRM, Berlin, Germany, 2007) (Abstract 40). and heart (see, e.g., He T et al., *Development of a novel optimized breathhold technique for myocardial T2 measurement in thalassemia*, Journal of Magnetic Resonance Imaging 2006; 24 (3):580-585; He T, Kirk P et al., *Multi-center transferability of a breath-hold T2 technique for myocardial iron assessment*, Journal of Cardiovascular Magnetic Resonance 2008; 10 (1):11; Gouya H et al., *Rapidly reversible myocardial edema in patients with acromegaly: assessment with ultrafast T2 mapping in a single-breath-hold MRI sequence*, American Journal of Roentgenology 2008; 190 (6):1576-1582) with each sequence demonstrating potentially adequate image quality. Although these sequences may be considered as important developments, each can be subject to systematic errors in $R_2$ measurement when compared with a CPMG pulse sequence, for example.

One of the objects of the present disclosure is to address and/or overcome at least some of the deficiencies as described herein above, and/or to overcome the exemplary deficiencies commonly associated with the prior art as, e.g., described herein. Another object of the present disclosure is to provide an exemplary embodiment of a breath-hold multi-echo FSE pulse sequence for accurate $R_2$ measurement in the liver, heart, brain and other organs. Another object of the present disclosure is to compare such exemplary FSE pulse sequence with a navigator-gated CPMG pulse sequence. Yet another object of the present disclosure is to provide one or more relatively and/or sufficiently accurate exemplary non-invasive techniques and/or procedures for assessing tissue iron in disorders with iron overload and for monitoring the effectiveness of iron-chelating therapy in patients with transfusional iron overload, for example.

SUMMARY OF EXEMPLARY EMBODIMENTS OF THE DISCLOSURE

Indeed, exemplary measurements of proton transverse relaxation rates ($R_2$) can generally be a useful means for quantitative characterization of pathological changes in tissue with a variety of clinical applications. Likely the most widely used $R_2$ measurement method may be the Carr-Purcell-Meiboom-Gill (CPMG) pulse sequence but its relatively long scan time can typically require respiratory gating for chest or body MRI, which can render this approach impractical for comprehensive assessment within a clinically acceptable examination time, for example. Exemplary embodiment of the present disclosure provides an exemplary breath-hold multi-echo fast spin-echo (FSE) sequence for relatively accurate measurement of, e.g., $R_2$ in the liver and heart. For example, it is possible to compare the FSE data with the corresponding even-echo CPMG data. For pooled data, the $R_2$ measurements can be strongly correlated (e.g., Pearson correlation coefficient=0.99) and in excellent agreement (e.g., mean difference [CPMG-FSE]=0.10 s−1; 95% limits of agreement were 1.98 and −1.78 s−1) between the two exemplary pulse sequences.

For example, according to certain exemplary embodiments according to the present disclosure, exemplary computer-accessible medium can be provided having instructions thereon for generating multiple images associated with at least one anatomical structure using magnetic resonance imaging (MRI) data. When a computing arrangement executes the instructions, the computing arrangement can be configured to, e.g., obtain at least one multi-echo fast spin-echo (FSE) pulse sequence based on the MRI data, which can include hardware specifications of the MRI system, and generate each of the images based on multiple echoes produced by the multi-echo FSE pulse sequence(s) using a reverse centric k-space reordering procedure and employing a turbo factor having an even value.

The exemplary echo train produced by the multi-echo FSE can include at least two successive echoes (e.g., turbo factor=2) which can be used to generate at least one of the images. For example, with a turbo factor of 2, at least one of the images can be generated by an odd echo and an even echo acquiring outer and inner halves of k-space, respectively. In certain exemplary embodiments according to the present disclosure, for a turbo factor of 4, at least four successive echoes (e.g., turbo factor=4) can be used to generate at least one of the images. For example, echo 4 can fill the center of k-space, with echo 3 filling an area of k-space on both sides and/or above and below echo 4, with echo 2 filling an area of k-space on both sides and/or above and below echo 3, and echo 1 filling an area of k-space on both sides and/or above and below echo 2. This exemplary pattern can be represented by, e.g., "1 2 3 4 3 2 1", where 1 is echo 1, 2 is echo 2, 3 is echo 3, and 4 is echo 4. The exemplary turbo factor can have a value of, e.g., 2, or 4, which can depend on the application for which the exemplary computer-accessible medium may be used, for example.

In accordance with certain exemplary embodiments of the present disclosure, the computing arrangement can be further configured to obtain the MRI data in a single breath-hold. The acquired MRI data can pertain to and/or include information associated with at least one of, e.g., liver, heart, pancreas, kidney, brain, cartilage, and/or prostate. Further, in certain exemplary embodiments according to the present disclosure, the acquired MRI data can pertain to and/or include information associated with at least two of, e.g., liver, heart, pancreas, and/or brain.

Additionally, the exemplary computing arrangement can be further configured to determine proton transverse relaxation rates and/or proton transverse relaxation times for generating at least one of the images, for example. Further, according to the present disclosure, the exemplary computing arrangement can be further configured to perform a quantitative assessment of, e.g., iron deposition in the anatomical structure(s) from the MRI data. For example, the quantitative assessment can be regarding and/or of information associated with, e.g., hepatic iron deposition, myocardial iron deposition, and/or brain iron deposition. Further, according to the present disclosure, the exemplary computing arrangement can be further configured to perform a quantitative assessment of, e.g., edema in the anatomical structure(s) from the MRI data. For example, the quantitative assessment can be regarding and/or of information associated with, e.g., acute myocarditis, acute myocardial infarction, cardiac transplantation rejection, muscle and/or cartilage injury.

Also provided herein is an exemplary embodiment of a method for generating multiple images associated with at least one anatomical structure using MRI data. For example, the method can include, e.g., obtaining at least one multi-echo FSE pulse sequence based on the MRI data, which can include, e.g., hardware specifications of the MRI system, and generating each of the images based on multiple echoes produced by the FSE pulse sequence(s) using a reverse centric k-space reordering procedure and employing a turbo factor having an even value, which can be performed with the use of a computing and/or arrangement that can include one or more hardware processors. The exemplary echoes can include, e.g., at least two successive echoes which can be used to generate at least one of the images. For example, for a turbo factor of 2, the image(s) can be generated by an odd echo and an even echo acquiring outer and inner halves of k-space, respectively. In certain exemplary embodiments according to the present disclosure, the turbo factor can have a value of, e.g., 2, or 4, which can depend on the application for which the exemplary method may be used, for example.

Further, the exemplary method in accordance with certain exemplary embodiments of the present disclosure can further include determining proton transverse relaxation rates and/or proton transverse relaxation times for generating at least one of the images. Additionally, the exemplary method can further include the display and/or storage of information associated with the image(s), and/or of the proton transverse relaxation rates and/or the proton transverse relaxation times for generating the image(s) in a storage arrangement in a user-accessible format and/or a user-readable format.

In yet another exemplary embodiment according to the present disclosure, a system is provided for generating a plurality of images associated with at least one anatomical structure using magnetic resonance imaging (MRI) data, which can include, e.g., a computer-accessible medium having executable instructions thereon. For example, when the computing arrangement(s) executes the instructions, the computing arrangement(s) can be configured to, e.g., obtain at least one multi-echo fast spin-echo (FSE) pulse sequence based on the MRI data, which can include, e.g., hardware specifications of the MRI system, and generate each of the images based on multiple echoes produced by the FSE pulse sequence(s) using a reverse centric k-space reordering procedure and employing an even turbo factor (e.g., a turbo factor having an even value).

The exemplary echoes can include, e.g., at least two successive echoes which can be used to generate at least one of the images. For example, with a turbo factor of 2, the image(s) can be generated by an odd echo and an even echo acquiring outer and inner halves of k-space, respectively. In certain exemplary embodiments according to the present disclosure, the turbo factor can have a value of, e.g., 2 or 4, which can depend on the application for which the exemplary system may be used, for example. Further, the exemplary computing arrangement can be further configured to, e.g., determine proton transverse relaxation rates and/or proton transverse relaxation times for generating at least one of the images.

These and other objects, features and advantages of the present disclosure will become apparent upon reading the following detailed description of exemplary embodiments of the present disclosure, when taken in conjunction with the accompanying exemplary drawings and appended claims.

BRIEF DESCRIPTION OF THE DRAWINGS

The foregoing and other objects of the present disclosure will be apparent upon consideration of the following detailed description, taken in conjunction with the accompanying exemplary drawings and claims showing illustrative embodiments of the invention, in which:

FIG. 1(a) is an exemplary graph of a navigator-gated CPMG pulse sequence, in accordance with exemplary embodiments of the present disclosure;

FIG. 1(b) is a block/sequence diagram 110 of a breath-hold multi-echo FSE sequence, in accordance with exemplary embodiments of the present disclosure;

FIG. 1(c) is an exemplary graph providing an illustration of a corresponding k-space of the exemplary CPMG shown in FIG. 1(a), in accordance with exemplary embodiments of the present disclosure;

FIG. 1(d) is a block/sequence diagram providing an illustration of a corresponding k-space of the exemplary FSE with reverse centric k-space reordering and TF=2 shown in FIG. 1(b), in accordance with exemplary embodiments of the present disclosure;

FIGS. 7(a) and 7(b) are exemplary scatter plots showing linear correlation and Bland-Altman analysis of intra-study repeatability of $R_2$ measurements produced by an exemplary breath-hold multi-echo FSE sequence, respectively, in accordance with certain exemplary embodiments of the present disclosure;

FIGS. 7(c) and 7(d) are exemplary plots showing linear correlation and Bland-Altman analysis of exemplary inter-study repeatability of $R_2$ measurements produced by the breath-hold multi-echo FSE sequence, respectively, according to certain exemplary embodiments of the present disclosure;

Figures 2A, 2B:
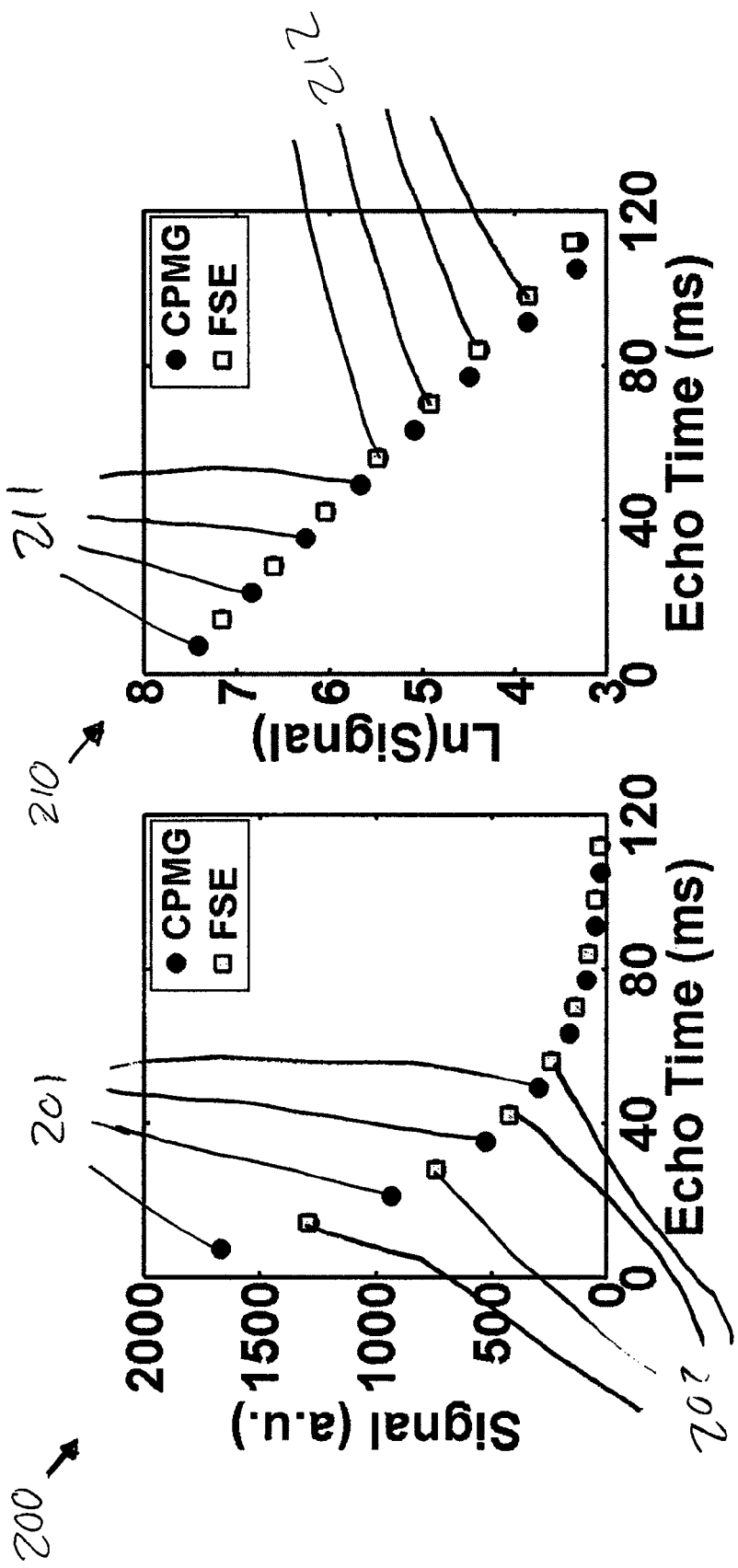
FIGS. 2(a) and 2(b) are exemplary graphs illustrating exemplary linear and natural logarithm plots of the $T_2$-weighted signal of an exemplary phantom as a function of echo time, respectively, in accordance with certain exemplary embodiments of the present disclosure.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative embodiments. It is intended that changes and modifications can be made to the described embodiments without departing from the true scope and spirit of the subject disclosure.

DETAILED DESCRIPTION OF EXEMPLARY EMBODIMENTS

Exemplary Multi-Echo FSE with Even-Echo CPMG Characteristics

FIGS. 1(a) and 1(b) show exemplary pulse sequence diagrams of CPMG and multi-echo FSE with TF of 2, respectively. In particular, FIG. 1(a) illustrates an exemplary schematic diagram 100 of navigator-gated CPMG, and FIG. 1(b) shows an exemplary schematic diagram 110 of breath-hold multi-echo FSE sequences, in accordance with certain exemplary embodiments of the present disclosure.

In the examples of FIGS. 1(a) and 1(b), lines 101, 111 represent echoes E corresponding to the exemplary CPMG and Multi-Echo FSE, respectively, for 4 images I. Lines 104, 114 represent exemplary slice-select gradient $G_z$ corresponding to exemplary CPMG and Multi-Echo FSE, respectively. Lines 103, 113 represent exemplary phase-encoding gradient $G_y$ corresponding to the exemplary CPMG and Multi-Echo FSE, respectively. Exemplary lines 102, 112 represent exemplary frequency-encoding gradient $G_x$ corresponding to the exemplary CPMG and Multi-Echo FSE, respectively. Further, lines 105, 115 represent exemplary excitation radio-frequency (RF) pulse corresponding to the exemplary CPMG and Multi-Echo FSE, respectively; and lines 106, 116 represent refocusing RF pulses corresponding to the exemplary CPMG and Multi-Echo FSE, respectively.

FIGS. 1(*c*) and 1(*d*) show exemplary corresponding k-spaces of the exemplary CPMG of FIG. 1(*a*), and exemplary k-space of the exemplary FSE with reverse centric k-space reordering and TF=2 of FIG. 1(*b*), respectively. As shown in FIGS. 1(*a*) and 1(*b*), there can be a significant difference between the two sequences in phase-encoding.

For example, in the CPMG procedure, each spin echo can form an image. As shown in FIG. 1(*c*), echo 1 121 can form Image 1 123, and echo 2 122 can form Image 2 124. In the presence of a radio-frequency (RF) field variation, the corresponding flip angle variation can produce a signal error. The use of phase-cycling can correct for a flip angle variation for even echoes, and subsequently yield asymmetry in signal amplitude between the odd and even echoes. The even echo can also be motion compensated for motion along the frequency-encoding direction (see, e.g., Kucharczyk W et al., *MR technology: effect of even-echo rephasing on calculated T2 values and T2 images*, Radiology 1985; 157 (1):95-101. As such, even echoes in CPMG can be more accurate than, e.g., odd echoes for $R_2$ quantification. This characteristic of a CPMG sequence can be used to provide a multi-echo FSE pulse sequence with a turbo factor (TF) of 2 and "reverse centric" k-space reordering, where two successive echoes can form an image with the odd and even echoes, filling the outer and inner halves of k-space, respectively. For example, as shown in FIG. 1(*d*), echo 1 131 and echo 2 132 can form image 1, with these odd and even echoes filling the outer and inner halves of k-space 135. Similarly, echo 3 133 and echo 4 134 can form image 2, with these odd and even echoes filling the outer and inner halves of k-space 135. In certain exemplary embodiments according to the present disclosure, a turbo factor of greater than 2 can be utilized, such as 4. For a turbo factor of 4, for example, echo 4 can fill the center of k-space, with echo 3 filling an area of k-space on both sides and/or above and below echo 4, with echo 2 filling an area of k-space on both sides and/or above and below echo 3, and echo 1 filling an area of k-space on both sides and/or above and below echo 2. This exemplary pattern can be represented by, e.g., "1 2 3 4 3 2 1", where 1 is echo 1, 2 is echo 2, 3 is echo 3, and 4 is echo 4.

Characteristically, this exemplary multi-echo FSE pulse sequence can behave similarly to an even-echo CPMG sequence with an acceleration factor of 2 and can be, therefore, compatible with breath-hold imaging, for example. It is possible that negligible high-pass filtering effects along the phase-encoding direction can be associated with the exemplary multi-echo FSE pulse sequence (see, e.g., Constable R T et al., *The loss of small objects in variable TE imaging: implications for FSE, RARE, and EPI*. Magnetic Resonance in Medicine 1992; 28 (1):9-24).

Exemplary Pulse Sequence

In certain exemplary embodiments according to the present disclosure, CPMG and multi-echo FSE sequences can be implemented on, e.g., a 1.5 T whole-body MR scanner (such as Avanto, from Siemens Medical Solutions, Erlangen, Germany) or a 3 T whole-body MR scanner (such as Tim Trio, from Siemens Medical Solutions, Erlangen, Germany), both equipped with a gradient system capable of achieving a maximum gradient strength of 45 mT/m and a slew rate of 200 T/m/s, for example. An exemplary RF excitation can be performed using a transmit body coil, and a 32-element cardiac coil array can be utilized for signal reception, for example.

Exemplary relevant imaging parameters for both the CPMG and multi-echo FSE pulse sequences can include, e.g., field of view (FOV)=340×276 mm, matrix=128×72, spatial resolution=2.66 mm×3.83 mm, slice thickness=10 mm, generalized auto calibrating partially parallel acquisitions (GRAPPA) (see, e.g., Griswold M A et al., *Generalized auto-calibrating partially parallel acquisitions (GRAPPA)*, Magnetic Resonance in Medicine 2002; 47 (6):1202-1210. with, e.g., an acceleration factor=1.6, receiver bandwidth (BW)= 500 Hz/pixel, excitation RF pulse duration=2.05 ms, refocusing RF pulse duration=2.56 ms, echo spacing (ESP)=5.6 ms, number of images=10, echo-train duration=118 ms, TR=800 ms (for phantom and liver imaging), scan time=22 echo trains, and double-inversion, black-blood preparation pulse. The inter-image time of the CPMG can be about equal to that of the ESP, whereas the inter-image time of the FSE can be about twice that of the ESP for a turbo factor of 2. It should be understood that other parameters can be utilized, and are within the scope of the exemplary embodiments of the present disclosure.

For example, to reduce stimulated echoes from imaging slice edges for both the CPMG and FSE pulse sequences, the slice thickness of the refocusing RF pulse can be set to, e.g., about three times that of the excitation RF pulse. (see, e.g., Pell G S et al., *Optimized clinical T2 relaxometry with a standard CPMG sequence*, Journal of Magnetic Resonance Imaging 2006; 23 (2):248-252.) Moreover, exemplary embodiments of the present disclosure can provide for a rapid $R_2$ quantification.

Exemplary Phantom Imaging

In accordance with certain exemplary embodiments of the present disclosure, exemplary phantom imaging can be performed. For example, an exemplary phantom can include, e.g., about five bottles containing different exemplary concentrations of manganese chloride ($MnCl_2$) in distilled water: 0.135, 0.270, 0.405, 0.540, and 0.675 mM. $MnCl_2$ can have $T_1/T_2 \approx 10$ at 1.5 T (see, e.g., Ulmer J L et al., *Magnetization transfer or spin-lock? An investigation of off-resonance saturation pulse imaging with varying frequency offsets*, American Journal of Neuroradiology 1996; 17 (5):805-819. which can be comparable to that of tissues and aqueous ferritin iron (see, e.g., Vymazal J. et al., *T1 and T2 of ferritin solutions: effect of loading factor*, Magnetic Resonance in Medicine 1996; 36 (1):61-65). Exemplary concentration values can produce a range of clinically relevant $R_2$ values.

Exemplary In Vivo Imaging

According to various exemplary embodiments of the present disclosure, e.g., seven controls (two females, five males; mean age=29.4±7.1 years) and seven patients (3 females; 4 males; mean age=29.3±10.7 years) with thalassemia major can be imaged at 1.5 T. An axial plane of the liver can be imaged immediately above the right kidney. Electrocardiogram (ECG) triggering can be used to image a mid-ventricular short-axis plane at mid diastole (trigger delay=500 ms). The breath-hold duration of the multi-echo FSE sequence can be 17.6 s for liver imaging and 22-16.5 s for ECG-triggered cardiac imaging (e.g., for heart rate=60-80 beats per minute [bpm], respectively). The scan duration of the navigator-gated CPMG pulse sequence can be on the order of about 5-7 min, depending on the respiratory cycle and ECG triggering. Human imaging can be performed in accordance with appropriate protocols. It should be understood that other controls can be employed and are within the scope of the exemplary embodiments of the present disclosure.

Exemplary Intra- and Inter-Study Repeatability

An exemplary intra-study repeatability of an exemplary breath-hold multi-echo FSE pulse sequence can be assessed in, e.g., five controls and three patients by repeating the breath-hold acquisitions during the same MR examination session. An exemplary inter-study repeatability of the exemplary pulse sequence can be assessed in, e.g., five patients by repeating the breath-hold acquisitions at least one week after the first examination. Anatomic landmarks can be used to reproduce the same imaging planes, for example.

Exemplary Image and Statistical Analysis

According to one exemplary embodiment of the present disclosure, for each $MnCl_2$ phantom bottle, a region-of-interest (ROI) covering the whole bottle can be generated using an exemplary image intensity thresholding procedure, and the corresponding pixel-by-pixel $R_2$ map can be calculated by non-linear least square fitting of the mono-exponential relaxation curve, which can be done using, e.g., the MATLAB®R2008a software (Mathworks, Natick, Mass.). For each bottle, the mean $R_2$ can be calculated/determined. Such five mean $R_2$ measurements can be plotted as a function of concentration, and the relaxivity of $MnCl_2$ can be calculated by performing a linear regression analysis procedure.

According to another exemplary embodiment of the present disclosure, for $R_2$ measurement of the liver and heart, the exemplary images can be manually cropped to isolate the organ of interest. A region-of-interest (ROI) can be manually generated to mask the whole liver and heart. The corresponding pixel-by-pixel $R_2$ map can be determined by non-linear least square fitting of the mono-exponential relaxation curve. For each exemplary ROI, the mean and standard deviation of $R_2$ can be calculated. For each organ of interest, the mean $R_2$ measurements between the control and patient groups can be compared using, e.g., the paired-sample t-test (two-tailed). To compare the breath-hold multi-echo FSE and the navigator-gated CPMG pulse sequences, both Pearson correlation and Bland-Altman analyses can be performed, for example. The repeatability of the breath-hold multi-echo FSE sequence can be assessed by, e.g., performing the Pearson correlation and Bland-Altman analyses. The coefficient of variation (CV) can be calculated as the standard deviation (SD) of the differences between the two repeated measurements, divided by their mean, for example. The reported values represent mean±SD. A $p<0.05$ can be considered statistically significant.

FIGS. 2(a) and 2(b) illustrate exemplary graphs 200, 210 that show exemplary linear and natural logarithm plots of the $T_2$-weighted signal of the 0.540 mM $MnCl_2$ phantom as a function of echo time, respectively, in accordance with certain exemplary embodiments of the present disclosure. Circles 201, 211 represent CPMG plots, and squares 202, 212 represent FSE plots. As shown in FIGS. 2(a) and 2(b), the exemplary CPMG sequence can provide asymmetry in signal amplitude between the odd and even images, especially towards the tail end of the exemplary echo train. Consistent with an exemplary pulse sequence according to the exemplary embodiments of the present disclosure, the multi-echo FSE sequence can provide essentially the same signal as the even-echo CPMG.

Figure 3:
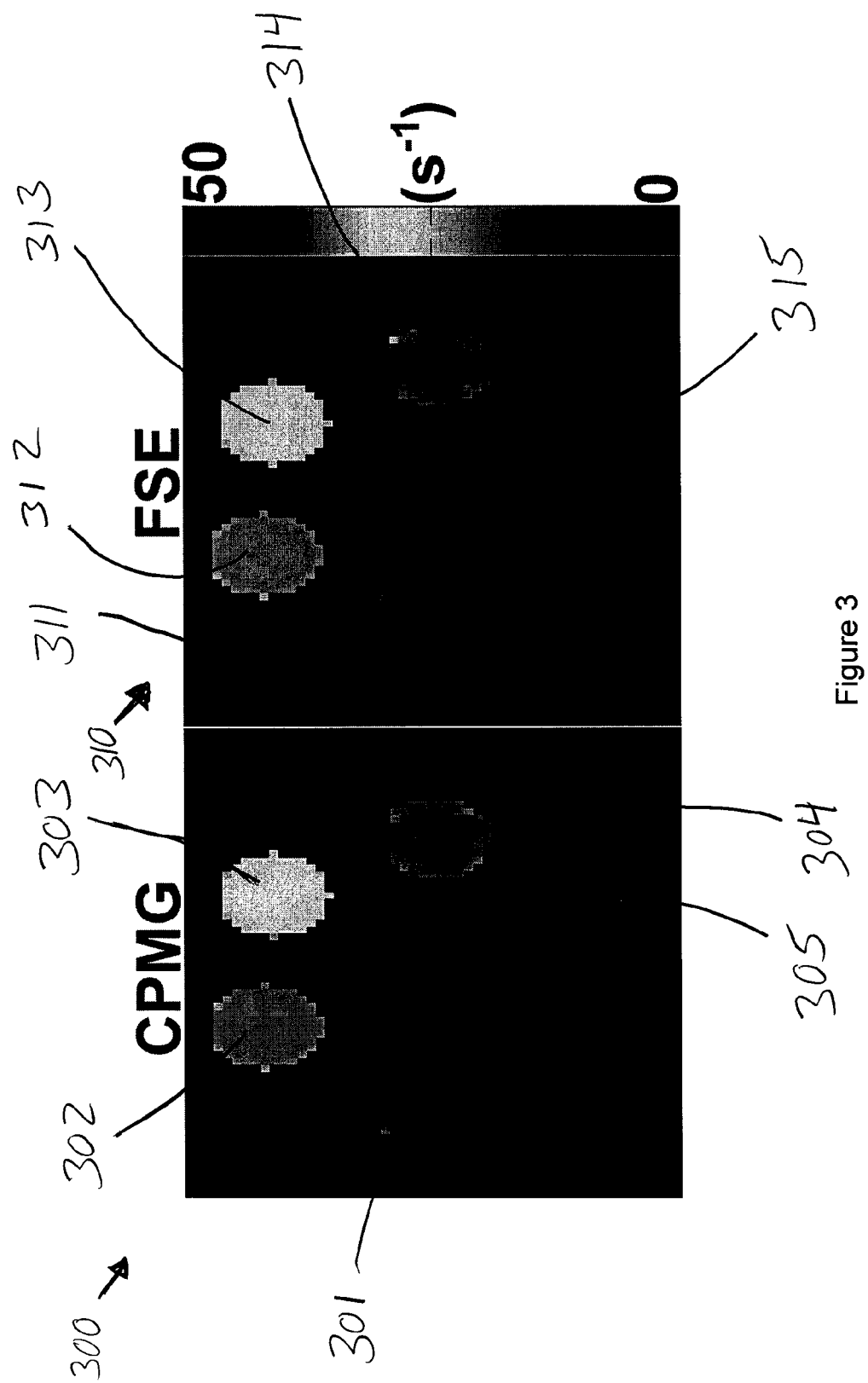
FIG. 3 shows exemplary $R_2$ maps of five exemplary phantom bottles calculated from even-echo CPMG and multi-echo FSE data, in accordance with certain exemplary embodiments of the present disclosure.

FIG. 3 shows exemplary $R_2$ maps 300, 310 of five exemplary phantom bottles calculated from the even-echo CPMG and multi-echo FSE data, in accordance with certain exemplary embodiments of the present disclosure. In particular, FIG. 3 illustrates exemplary $R_2$ maps of the $MnCl_2$ phantom bottles, and provides that $R_2$ maps 300 can be based on even-echo CPMG, and includes areas 301-305 corresponding to the five exemplary phantom bottles of this example. $R_2$ maps 310 can be based on the multi-echo FSE sequence data, and can include areas 311-315 corresponding to the five exemplary phantom bottles of this example. According to this exemplary embodiment, the $R_2$ maps can be displayed in grayscale and/or with color scales ranging from, e.g., about 0 to 50 $s^{-1}$.

As shown in FIG. 3, the exemplary $R_2$ maps 300, 310 can closely correspond to and/or be in agreement with one another, as can be seen by comparing the areas 301-305 and 311-315, respectively. Exemplary even-echo CPMG and multi-echo FSE sequences can yield transverse relaxivities of, e.g., about 72.1 and 72.3 $s^{-1}$/mM, which can be consistent with the exemplary values of about 71.4 $s^{-1}$/mM that can be measured with a CPMG sequence by Ulmer and co-workers (see, e.g., Ulmer J L, et al. supra.) and about 74.2 $s^{-1}$/mM which can be measured with a single spin echo sequence by St. Pierre and co-workers (see, e.g., St Pierre T G et al., *Single spin-echo proton transverse relaxometry of iron-loaded liver*, NMR in Biomedicine 2004; 17 (7):446-458), for example.

Figure 4:
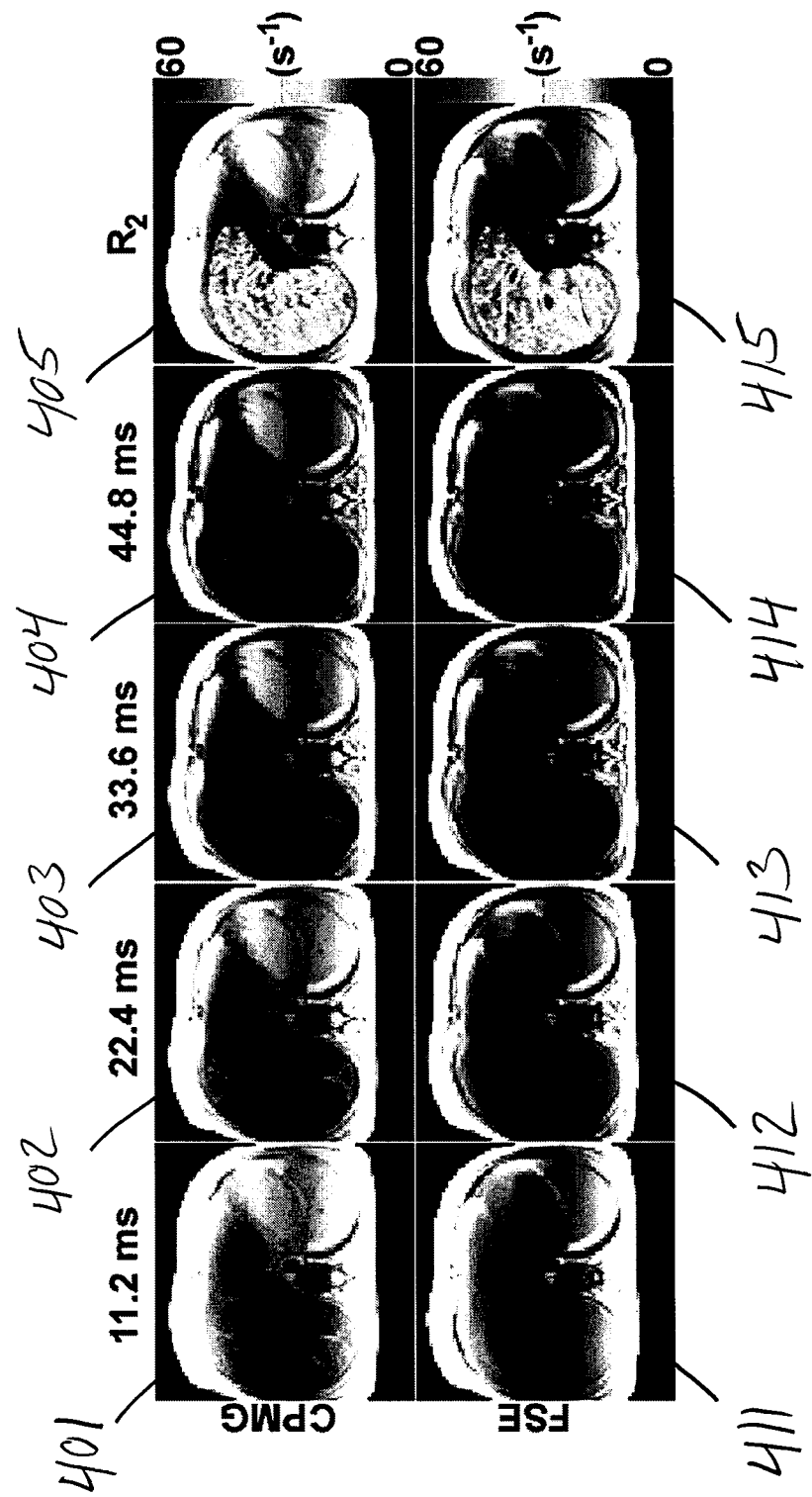
FIG. 4 is a group of exemplary representative hepatic images of a patient with thalassemia major, as well as the corresponding exemplary $R_2$ maps produced by two exemplary pulse sequences, in accordance with certain exemplary embodiments of the present disclosure.

FIG. 4 shows a group of exemplary representative hepatic images 401-404 and 411-414 of a patient with thalassemia major, as well as the corresponding exemplary $R_2$ maps 405, 415 produced by two exemplary pulse sequences. In particular, FIG. 4 shows exemplary representative liver images of a patient at TE of 11.2, 22.4, 33.6, and 44.8 ms, in accordance with certain exemplary embodiments of the present disclosure. In this example, exemplary images 401-404 are based on even-echo CPMG, and exemplary images 411-414 are based on multi-echo FSE. The corresponding exemplary $R_2$ maps 405, 415 can exhibit excellent agreement between the two exemplary CPMG and FSE pulse sequences. Exemplary $R_2$ maps 405, 415 can correspond to exemplary images 401-404 and 411-414, respectively, and can be displayed in grayscale and/or with color scales ranging from, e.g., 0 to 60 $s^{-1}$.

Figure 5:
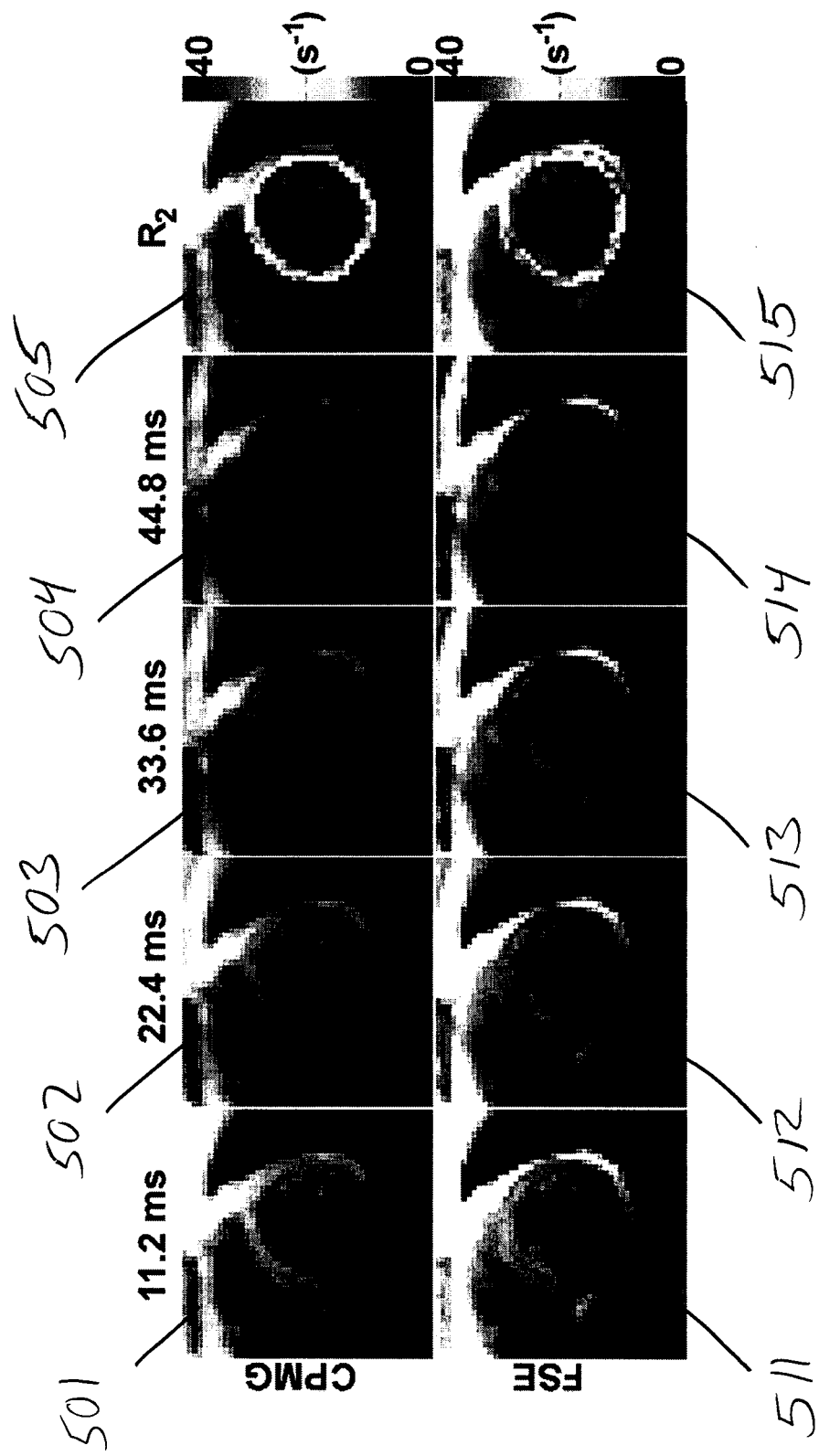
FIG. 5 is a group of exemplary representative cardiac images from the exemplary patient associated with the images of FIG. 4, as well as the corresponding exemplary $R_2$ maps that can be produced by exemplary CPMG and FSE pulse sequences, in accordance with certain exemplary embodiments of the present disclosure.

FIG. 5 shows exemplary representative cardiac images 501-504 and 511-514 from the exemplary patient associated with the graphs of FIG. 4, as well as the corresponding exemplary $R_2$ maps 505, 515 that can be produced by the two exemplary pulse sequences CPMG and FSE. As shown in FIG. 5, compared with the navigator-gated even-echo CPMG sequence, a breath-hold multi-echo FSE sequence, in accordance with the exemplary embodiment of the present disclosure, can yield comparable image quality. The corresponding exemplary $R_2$ maps 505, 515 can exhibit excellent agreement between the two exemplary CPMG and FSE pulse sequences. Exemplary $R_2$ maps 505, 515 can be displayed in grayscale and/or with color scales ranging from, e.g., about 0 to 40 $s^{-1}$.

Figures 6A, 6B:
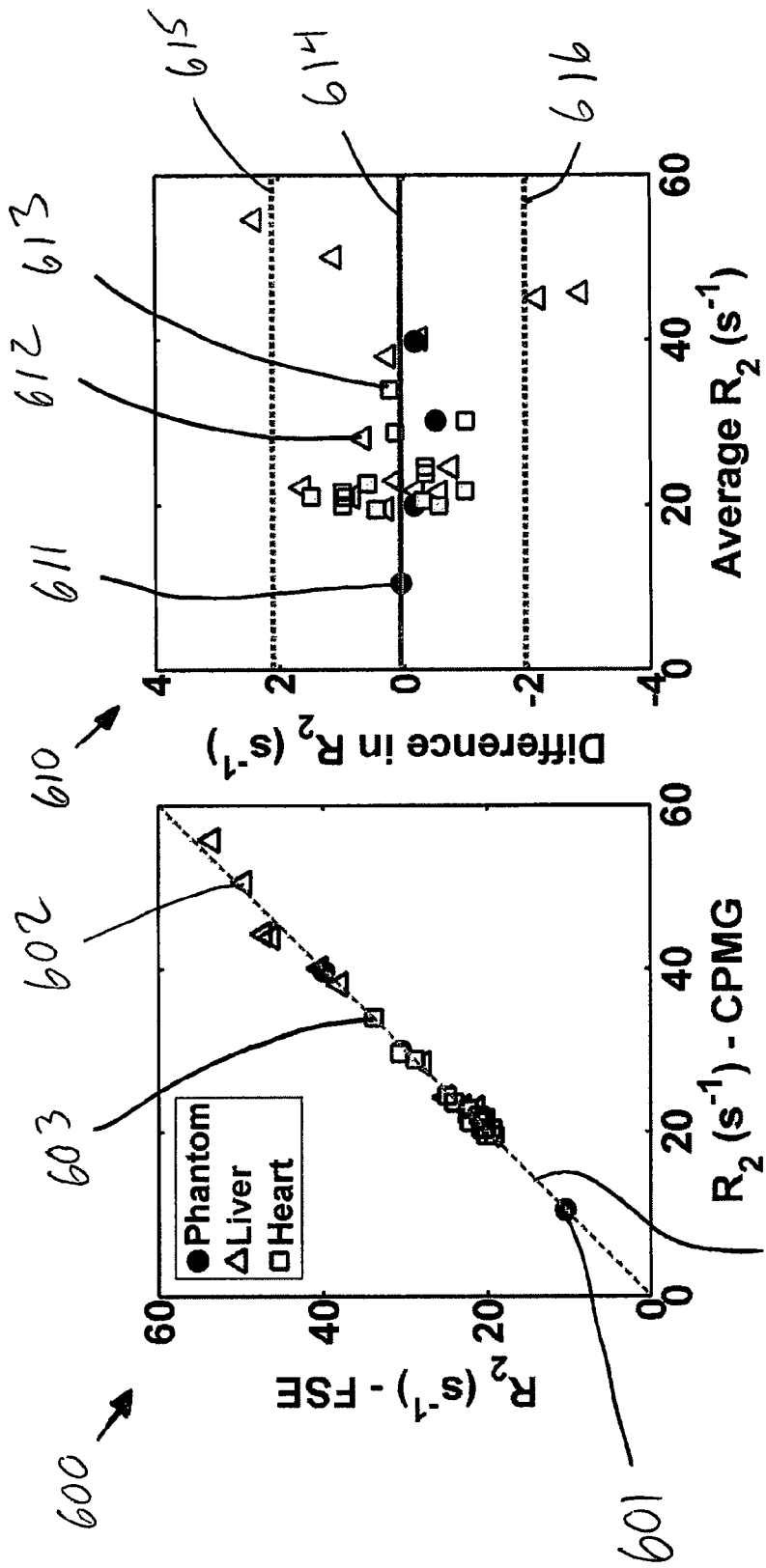
FIGS. 6(a) and 6(b) are exemplary graphs that illustrate exemplary scatter plots of linear correlation and Bland-Altman analysis of $R_2$ measurements between even-echo CPMG and multi-echo FSE, respectively, in accordance with certain exemplary embodiments of the present disclosure.

FIGS. 6(a) and 6(b) show exemplary graphs 600, 610 that illustrate exemplary scatter plots 601-603 and 611-613 of linear correlation (a) and Bland-Altman (b) analysis of $R_2$ measurements between even-echo CPMG and multi-echo FSE, respectively. As shown in FIGS. 6(a) and 6(b), for pooled data, the mean $R_2$ values can be correlated (e.g., Pearson correlation coefficient R=0.99; p<0.001; n=32) and in good agreement (e.g., mean difference (e.g., CPMG−FSE)= 0.07 $s^{-1}$ can be represented by solid line 614). Exemplary dotted line 604 can indicate that the scatter plots 601-603 and 611-613 can be, e.g., in perfect (or near perfect) unity, and thus in a one-to-one relationship with each other. Exemplary upper and lower 95% limits of agreement can be 2.10 and −1.97 $s^{-1}$, respectively, and represented by dotted lines 615 and 616, respectively.

Exemplary Table 1 provided herein shows the corresponding exemplary statistics of the exemplary subgroups (e.g., phantom, liver, heart, all) of the example of FIG. 6. The exemplary Pearson correlation and Bland-Altman statistics of $R_2$ measurements can be calculated from the even-echo CPMG and multi-echo FSE data. The difference can be defined as $R_2$ (CPMG)–$R_2$ (FSE), for example.

EXEMPLARY TABLE 1

| | Pearson Correlation | | Bland-Altman | | |
|---|---|---|---|---|---|
| | | | Difference | Upper 95% | Lower 95% |
| Object | R | P | ($s^{-1}$) | limit ($s^{-1}$) | limit ($s^{-1}$) |
| Phantom (n = 4) | 0.99 | 0.02 | −0.02 | 0.25 | −0.66 |
| Liver (n = 14) | 0.99 | <0.001 | 0.04 | 2.75 | −2.67 |
| Heart (n = 14) | 0.98 | <0.001 | 0.17 | 1.70 | −1.36 |
| All (n = 32) | 0.99 | <0.001 | 0.07 | 2.10 | −1.97 |

Exemplary Table 2 provided herein provides a comparison of exemplary mean $R_2$ measurements of the liver and heart between the exemplary control and patient groups. Data represent mean±standard deviation (SD). As summarized in exemplary Table 2, for example, the mean hepatic $R_2$ of the exemplary patient group can be significantly greater than that of the exemplary control group (e.g., 43.2±8.6 $s^{-1}$ vs. 21.8±1.8 $s^{-1}$, respectively; p<0.001). Further, the mean myocardial $R_2$ of the exemplary patient group can be significantly greater than that of the control group (e.g., 26.1±5.2 $s^{-1}$ vs. 20.7±1.2 $s^{-1}$, respectively; p<0.04). These exemplary values can be consistent with previously reported $R_2$ measurements in controls and patients with thalassemia major (see, e.g., Voskaridou E et al., supra.; Alexopoulou E et al., supra.; He T, Gatehouse P D et al., supra.; He T, Kirk P et al., supra.; Huang T Y et al., *T2 measurement of the human myocardium using a T2-prepared transient-state TrueFISP sequence*, Magnetic Resonance in Medicine 2007; 57 (5):960-966), for example.

EXEMPLARY TABLE 2

| Organ | Control | Thalassemia Major |
|---|---|---|
| Liver | 21.8 ± 1.8 ($s^{-1}$) | 43.2 ± 8.6 ($s^{-1}$) |
| Heart | 20.7 ± 1.2 ($s^{-1}$) | 26.1 ± 5.2 ($s^{-1}$) |

FIGS. 7(a) and 7(b) show exemplary scatter plots 701, 702 and 711, 712 showing linear correlation and Bland-Altman analysis of intra-study repeatability of $R_2$ measurements produced by an exemplary breath-hold multi-echo FSE sequence, respectively, in accordance with the exemplary embodiments of the present disclosure. As shown in FIGS. 7(a) and 7(b), the exemplary repeated measurements can be strongly correlated (R=0.99; p<0.001; n=16). Exemplary dotted line 703 can represent, e.g., near perfect unity in the scatter plot 700. Exemplary Bland-Altman plot 710 can show excellent agreement between measurement 1 and measurement 2 (mean difference can be 0.29 $s^{-1}$, where it can be represented by solid line 713; upper and lower 95% limits of agreement being 1.40 and −0.82 $s^{-1}$, respectively, where the corresponding limits can be represented by dotted lines 714, 715, respectively). The intra-study CV can be 2.0% between two repeated multi-echo FSE image acquisitions. Exemplary Table 3 provided herein indicates the corresponding statistics of the subgroups (e.g., liver, heart, all) of the example of FIGS. 7(a) and 7(b). In particular, exemplary Table 3 provides results of calculations for intra-study repeatability of $R_2$ measurement by the exemplary multi-echo FSE sequence. The difference can be defined as $R_2$ (measurement 1)–$R_2$ (measurement 2), for example.

EXEMPLARY TABLE 3

| | Pearson Correlation | | Bland-Altman | | |
|---|---|---|---|---|---|
| | | | Difference | Upper 95% | Lower 95% |
| Object | R | p | ($s^{-1}$) | limit ($s^{-1}$) | limit ($s^{-1}$) |
| Liver (n = 8) | 0.99 | <0.001 | 0.45 | 1.52 | −0.63 |
| Heart (n = 8) | 0.99 | <0.001 | 0.13 | 1.24 | −0.98 |
| All (n = 16) | 0.99 | <0.001 | 0.29 | 1.40 | −0.82 |

FIGS. 7(c) and 7(d) show exemplary corresponding plots 721, 722 illustrating linear correlation and Bland-Altman analyses of exemplary inter-study repeatability of $R_2$ measurements produced by the breath-hold multi-echo FSE sequence, respectively. The exemplary repeated measurements can be strongly correlated (R=0.99; p<0.001; n=10). An exemplary dotted line 723 can represent, e.g., a perfect (or near perfect) unity in the scatter plot 720. Exemplary Bland-Altman plot 730 can show good agreement between measurement 1 and measurement 2 (e.g., mean difference can be 0.27 $s^{-1}$, where it can be represented by solid line 733; upper and lower 95% limits of agreement being 2.72 and −2.19 $s^{-1}$, respectively, where the corresponding limits can be represented by dotted lines 734, 735, respectively). The inter-study CV can be about 3.6% between two repeated multi-echo FSE image acquisitions, for example. Exemplary Table 4 provided herein shows the corresponding statistics of the subgroups (e.g., liver, heart, all) of the example of FIGS. 7(c) and 7(d). In particular, exemplary Table 4 provides results of calculations for inter-study repeatability of $R_2$ measurement by the exemplary multi-echo FSE sequence. The difference can be defined as $R_2$ (measurement 1)–$R_2$ (measurement 2), for example.

EXEMPLARY TABLE 4

| | Pearson Correlation | | Bland-Altman | | |
|---|---|---|---|---|---|
| | | | Difference | Upper 95% | Lower 95% |
| Object | R | p | ($s^{-1}$) | limit ($s^{-1}$) | limit ($s^{-1}$) |
| Liver (n = 5) | 0.97 | 0.005 | −0.08 | 2.88 | −3.05 |
| Heart (n = 5) | 0.99 | 0.002 | 0.62 | 2.50 | −1.27 |
| All (n = 10) | 0.99 | <0.001 | 0.29 | 1.40 | −0.82 |

Figure 8:
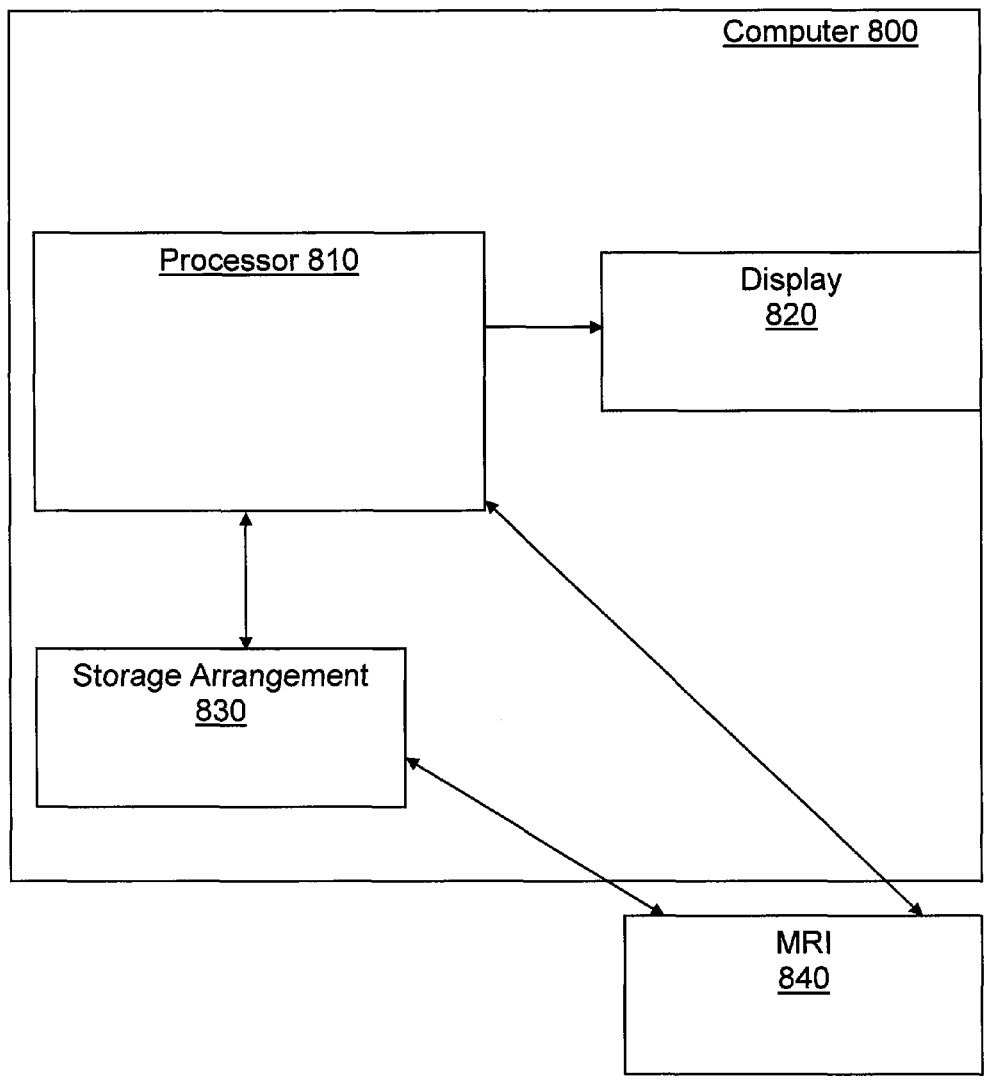
FIG. 8 is a block diagram of an exemplary embodiment of a system for generating an image using multi-echo FSE pulse sequence data associated with a subject, in accordance with the present disclosure.

FIG. 8 illustrates a block diagram of an exemplary embodiment of a system according to the present disclosure which is configured to implement the exemplary procedures described herein. A computer 800 can be provided having a processor/computer 810 which can include, e.g., one or more hardware processors and/or microprocessors, and be configured and/or programmed to perform the exemplary steps and/or procedures of the exemplary embodiments of the techniques described above. For example, an external device, such as a system which may include an MRI component 840, can provide measurements to the processor/computer 810. Such data can be associated with, for example, at least one portion of an anatomical structure. Other sensors and/or external devices or arrangements can be used to provide various types of data, e.g., external processors, biological sensors, etc. According to one exemplary embodiment of the present disclosure, the data can be stored in a storage arrangement 830 (e.g., hard drive, memory device, such as RAM, ROM, memory stick, floppy drive, etc.). The processor 810 can access the storage arrangement 830 to execute a computer program or a set of instructions (stored on or in the storage arrangement 830) which perform the procedures according to the exemplary embodiments of the present disclosure.

Thus, e.g., when the processor/computer 810 performs such instructions and/or computer program, the processor/computer 810 can be configured to perform the exemplary embodiments of the procedures according to the present disclosure, as described above herein. For example, the processor/computer 810 can receive the transmit RF calibration information from the MRI 840 relating to a sample. This information can be received directly from the MRI 840 or accessed from the storage arrangement. The processor/computer 810 can then determine information relating to the transmit RF calibration in a sample as a function of the received information.

A display 820 can also be provided for or in the exemplary system of FIG. 8. The storage arrangement 830 and the display 820 can be provided within the computer 800 or external from the processor/computer 800. The information received by the processor 810 and the information determined by the processor/computer 810, as well as the information stored on the storage arrangement 830 can be displayed on the display 820 in a user-readable format.

Figure 9:
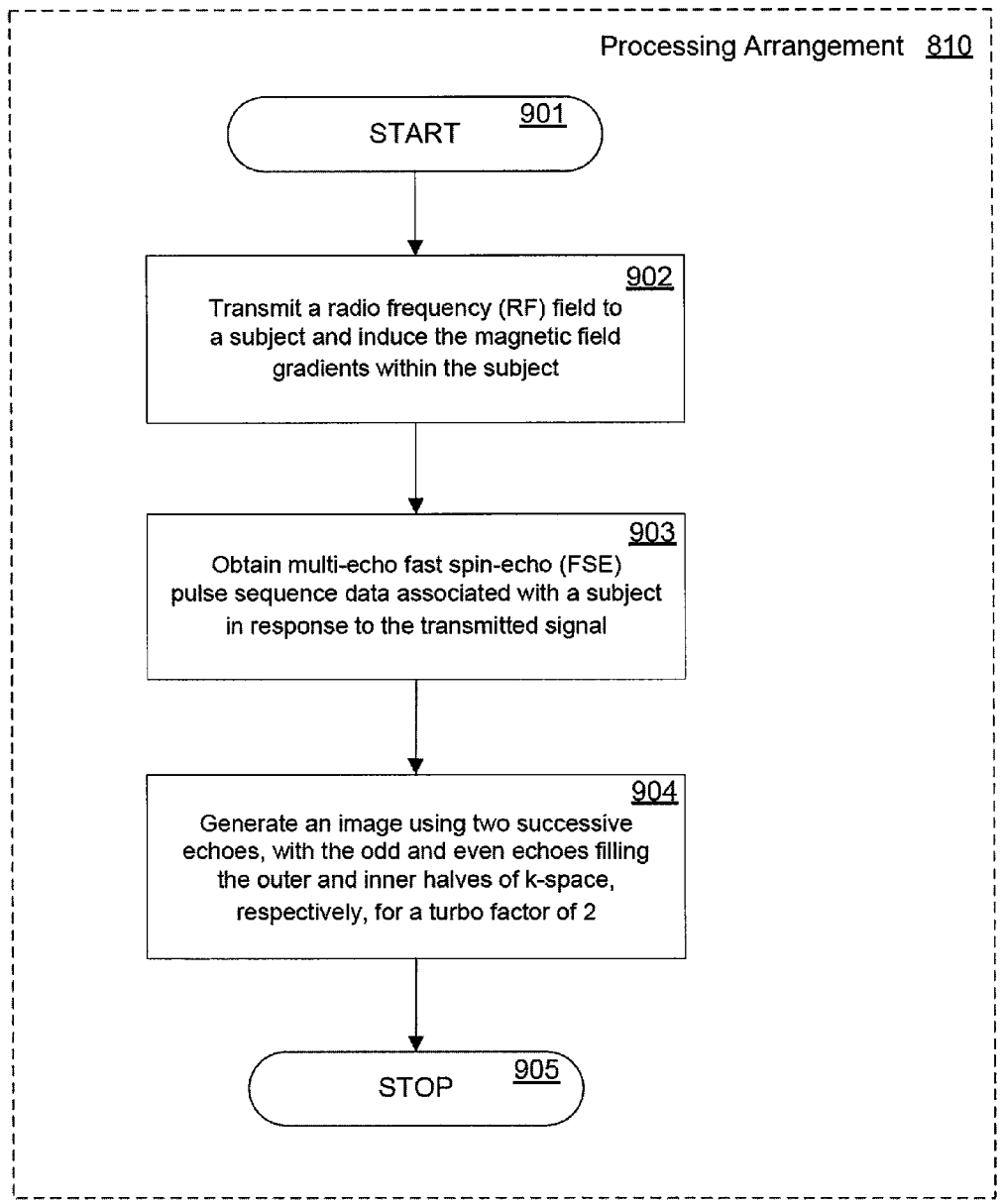
FIG. 9 is a flow diagram of an exemplary method for generating an image using multi-echo FSE pulse sequence data associated with a subject, in accordance with certain exemplary embodiments of the present disclosure.

FIG. 9 shows a flow diagram of a procedure in accordance with certain exemplary embodiments of the present disclosure. As shown in FIG. 9, the exemplary procedure can be executed on and/or by, e.g., the processing/computing arrangement 810. For example, starting at subprocess 901, the exemplary procedure can, in subprocess 902, transmit the RF field to a subject and induce the magnetic field gradients within a subject. Then, in subprocess 903, the exemplary procedure can obtain multi-echo fast spin-echo (FSE) pulse sequence data associated with a subject in response to the transmitted signal. Further, the exemplary procedure can, in subprocess 904, generate an image using two successive echoes, with the odd and even echoes filling the outer and inner halves of k-space, respectively, for a turbo factor of 2.

Further Exemplary Embodiments

Further exemplary embodiments according to the present disclosure can facilitate a performance of breath-hold multi-echo FSE acquisitions for accurate $R_2$ measurement in the liver and heart within a clinically acceptable breath-hold duration of 22-16.5 s (for heart rate=60-80 bpm, respectively). Both the exemplary even-echo CPMG and the exemplary multi-echo FSE sequences can yield essentially the same $MnCl_2$ phantom results, which can be consistent with previously reported transverse relativities (see, e.g., Ulmer J L et al., supra.) and (St Pierre T G et al. 2004, supra.). Compared with exemplary even-echo CPMG pulse sequences, exemplary multi-echo FSE sequences can produce results in vivo of comparable accuracy. The mean $R_2$ measurements of the liver and heart can be different between the exemplary control and patient groups, and their values can be consistent with previously reported $R_2$ values (see, e.g., Voskaridou E et al., supra.) and (Alexopoulou E et al., supra.; He T, Gatehouse P D et al., supra.). For exemplary subjects who can undergo repeated examinations, the breath-hold multi-echo FSE sequence produced $R_2$ measurements can be highly repeatable, both within and between studies (see, e.g., FIG. 7).

While a multiple single spin-echo pulse sequence with different TEs can be considered to be a reference standard for $R_2$ imaging, this exemplary technique can be too inefficient for clinical body imaging. Even-echo CPMG is known to be relatively insensitive to flip angle errors and can be considerably faster than the corresponding multiple single spin-echo imaging. Second, myocardial $R_2$ maps can be generated assuming robust cardiac image registration although gradual ventricular relaxation occurs during the 118 ms of data acquisition in mid diastole, even with a perfectly still breath hold. More complex image registration methods may be needed to eliminate this potential source of error in data fitting. Third, for the spatial resolution, the $R_2$ values can be sensitive to partial volume effects, particularly for the heart. Because of the differences in tissue characteristics between the heart and liver, it can be beneficial to separately optimize the spatial resolution and signal-to-noise ratio (SNR) for the heart and liver, for example, by increasing the spatial resolution for cardiac $R_2$ imaging at the expense of SNR. Fourth, exemplary multi-echo FSE pulse sequence can have only half the sampling rate as that of the CPMG sequence. The new FSE sequence with TE=11.2 ms can acquire at least two images above the noise for $R_2 \leq 89.3$ $s^{-1}$ (e.g., exponential decay for two time constants).

However, as indicated in the present disclosure and shown in the associated figures thereof (see, e.g., FIG. 2), the exemplary embodiment of the FSE sequence can have the same sampling rate as that of the accurate even-echo CPMG sequence. Further, the exemplary embodiment of the FSE sequence with TE=11.2 ms can produce a higher signal than a comparable single spin echo sequence with TE=11.2 ms. This can be because the exemplary FSE sequence can utilize a prior refocusing RF pulse to generate an odd echo at TE=5.6 ms. To compensate for signal loss for high $R_2$ tissues, the TE of the FSE pulse sequence can be further reduced to, e.g., 8.7 ms by employing shorter RF pulses (e.g., excitation pulse duration=1.02 ms; refocusing RF pulse duration=1.28 ms) at the same BW=500 Hz/pixel, without exceeding the specific absorption rate limit at 1.5 T, and the TE can be even further reduced to, e.g., 6.7 ms by employing BW=1000 Hz/pixel at the expense of 29% reduction in SNR, for example. The adjusted exemplary FSE sequence with TE=6.7 ms can acquire at least two images above the noise for $R_2 \leq 149.2$ $s^{-1}$. Highly iron overloaded tissue can also exhibit a higher $R_1$, which in turn can increase the longitudinal magnetization ($M_z$) recovery between repetition time (TR).

Nonetheless, for highly overloaded liver ($R_2 > 150$ $s^{-1}$), it can be preferable to perform navigator-gated multiple single spin echo experiments with relatively short TE (<5 ms). Fifth, the exemplary embodiment of the FSE pulse sequence may not be compatible with the $R_2$-iron concentration calibration derived from the single spin-echo studies by St. Pierre and colleagues (see, e.g., St Pierre TG et al. 2005, supra.; St Pierre T G et al., 2004, supra.), because the two pulse sequences can exhibit different $T_2$ relaxation (e.g., multi-echo spin echo vs. single echo spin echo, respectively). Sixth, the breath-hold duration of 22-16.5 s (for heart rate=60-80 bpm, respectively) can be relatively long for some patients with limited breath-hold capacity. For young pediatric patients, whose heart rate range can be typically higher (e.g., 80-120 bpm) than adults, the breath-hold duration can be, e.g., 16.5-11 s, respectively. Additional accelerating techniques, such as TSENSE (see, e.g., Kellman P et al., *Adaptive sensitivity encoding incorporating temporal filtering (TSENSE)*, Magnetic Resonance in Medicine 2001; 45 (5):846-852) and compressed sensing (see, e.g., Lustig M et al., *The application of compressed sensing for rapid MR imaging*, Magnetic Resonance in Medicine 2007; 58 (6):1182-1195), can be needed to further reduce the breath-hold duration for patients with limited breath-hold capacity.

For ECG-triggered cardiac FSE imaging, according to certain exemplary embodiments of the present disclosure, the TR can be equal to the R-R interval. Variation in the R-R interval (e.g., heart rate) can subsequently produce $T_1$-weighted amplitude oscillations in k-space. Relatively large oscillations near the center of k-space can cause image artifacts that can introduce errors. This can be known for ECG-gated spin echo pulse sequences with TR<5 $T_1$. The Bloch equation governing the longitudinal relaxation can be used to estimate the effect of heart rate variability on $M_z$ recovery. For example, $M_z=0$ at the end of each echo-train readout and scalar equilibrium magnetization=1. For normal myocardial with $T_1=850$ ms and heart rate=60 bpm, the relative error in $M_z$ can be calculated to be 5% and −6% for heart rate variation of 10% and −10%, respectively. For an edematous tissue with $T_1=1100$ ms and heart rate=60 bpm, the relative error in $M_z$ can be calculated to be 6% and −6% for heart rate variation of 10% and −10%, respectively. For an iron overloaded tissue with $T_1=600$ ms and heart rate=60 bpm, the relative error in $M_z$ is 4% and −4% for heart rate variation of 10% and −10%, respectively, for example. Accordingly, the exemplary effects of R-R variability on $R_2$ quantification can be relatively minimal even for a heterogeneous tissue, provided that the amplitude oscillation does not occur at the center of k-space.

The breath-hold multi-echo FSE can have certain advantages over the navigator-gated CPMG pulse sequence. First, exemplary data acquisition can be considerably faster and more efficient (16.5-22 s vs. 5-7 min, respectively), allowing more extensive sampling of the liver, heart, brain and other organs within a clinically feasible examination time. Second, navigator gating can require expert planning and can add additional time to the examination, whereas breath-hold imaging can be more robust and easier to perform. Navigator-gated CPMG scans can be susceptible to residual respiratory motion artifacts. Third, navigator gating can perform poorly in some patients, because the navigator excitation slab typically includes a portion of the liver. Navigator-gated CPMG can produce higher SNR and better blood suppression because the magnetization is usually fully recovered between each TR (i.e., one or more respiratory cycles), whereas in breath-hold multi-echo FSE the magnetization can recover for TR 750-1000 ms (e.g., for heart rate=80-60 bpm, respectively), for example. Additional pulse sequence optimization, such as dynamic black-blood RF preparation (see, e.g., He T, Gatehouse PD et al., supra.) can be used to improve the blood suppression for breath-hold multi-echo FSE.

Three different breath-hold spin echo pulse sequences can be used for hepatic (see, e.g., Leoffler R et al., supra. and myocardial (see, e.g., He T, Gatehouse P D et al., supra.) $R_2$ quantification. The first pulse sequence to compare and contrast may be multi-echo FSE with TF=3, centric k-space reordering, and scan time of 18 s (see, e.g., He T, Gatehouse P D et al., supra.; He T, Kirk P et al., supra.; Gouya H et al., supra.) for example. Exemplary multi-echo FSE pulse sequences in accordance with the present disclosure can have some potential advantages over this sequence. Exemplary FSE sequences can provide shorter ESP, which can be needed for reliable data fitting in patients with severe iron overload, especially for the liver, for example. In addition, the exemplary FSE sequence can be insensitive to asymmetry in signal amplitude between the odd and even echoes, whereas, e.g., the sequence described in reference 19 generates asymmetry in amplitude between the odd and even images because three consecutive echoes form an image. The second pulse sequence to compare and contrast can be the multi-echo FSE with echo sharing (see, e.g., Leoffler R et al., supra.). Exemplary embodiments according to the present disclosure of breath-hold multi-echo FSE can be advantageous by providing shorter ESP. In addition, the echo sharing scheme can utilize different k-space reordering for each reconstructed image, which can produce systematic errors in $R_2$ quantification. The third pulse sequence to compare and contrast can be a multiple half Fourier acquisition single shot turbo spin echo (HASTE) (see, e.g., Gouya H et al., supra.) sequence with different TEs. This pulse sequence can be subject to loss of spatial resolution due to $T_2$-blurring (see, e.g., Constable R T et al., supra.), which can be because in HASTE, all k-space lines are acquired with a single shot of refocusing RF pulses. Also, it can be difficult to accurately quantify $R_2$ using multiple single-shot HASTE acquisitions with different effective TEs, which can be due to each HASTE image being acquired with a single shot of all echoes. Exemplary embodiments according to the present disclosure do not have these limitations.

Exemplary embodiments according to the present disclosure of a breath-hold FSE pulse sequence can be used to perform accurate $R_2$ imaging of, e.g., the liver, heart and brain. Fast $R_2$ imaging is important for various applications, including pulse sequence protocol optimization with measured $R_2$. Furthermore, potential clinical applications of $R_2$ imaging with breath-hold FSE can include, e.g.: acute myocardial infarction (see, e.g., Willerson J T et al., supra.), acute myocarditis (Sekiguchi M et al., supra.), arrhythmogenic right ventricular cardiomyopathy (see, e.g., Sen-Chowdhry S, et al., supra.), and heart transplant rejection assessment (see, e.g., Sasaguri S et al., *Early detection of cardiac allograft rejection with proton nuclear magnetic resonance*, Circulation 1985; 72 (3 Pt 2):II231-236). This pulse sequence can also be applicable for quantitative assessment of hepatic, myocardial, and brain iron deposition, for example. The improved data acquisition efficiency of this pulse sequence can permit imaging of multiple organs and/or anatomical structures, including, e.g., the liver, heart, pancreas, and anterior pituitary, in a single comprehensive $R_2$ examination in patients with iron overload (see, e.g., Lam W W et al., *One-stop measurement of iron deposition in the anterior pituitary, liver, and heart in thalassemia patients*, Journal of Magnetic Resonance Imaging 2008; 28 (1):29-33). It should be understood that an anatomical structure can be, include or be a part of any anatomical structure, including, but not limited to, e.g., liver, heart, including left and/or right ventricles thereof, pancreas, brain, stomach, kidney, cartilage, uterus and/or anterior pituitary. Further, one having ordinary skill in the art should appreciate in view of the teachings of the present disclosure that, e.g., for the exemplary proton transverse relaxation rates ($R_2$) described herein, corresponding proton transverse relaxation times ($T_2$) can be calculated and/or determined therefrom based on one being the inverse of the other (e.g., $T_2=1/R_2$).

The foregoing merely illustrates the principles of the present disclosure. Various modifications and alterations to the described embodiments will be apparent to those having ordinary skill in art the in view of the teachings herein. It will thus be appreciated that those having ordinary skill in art will be able to devise numerous systems, arrangements, and methods which, although not explicitly shown or described herein, embody the principles of the disclosure and are thus within the spirit and scope of the disclosure. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words are intended to not be used synonymously. In addition, to the extent that the prior art knowledge has not been explicitly incorporated by reference herein above, it is explicitly being incorporated herein in its entirety. All publications and references referenced above are incorporated herein by reference in their entireties.

What is claimed is:

1. A non-transitory computer-accessible medium having instructions thereon for generating a plurality of images associated with at least one anatomical structure using magnetic resonance imaging (MRI) data, wherein, when a computing arrangement executes the instructions, the computing arrangement is configured to perform procedures which comprise:
    obtaining the data based on at least one multi-echo fast spin-echo (FSE) pulse sequence; and
    generating each of the images based on the data using a reverse centric k-space reordering procedure and employing a turbo factor having an even value.

2. The computer-accessible medium of claim 1, wherein the data includes hardware specifications of a MRI system.

3. The computer-accessible medium of claim 1, wherein the turbo factor has a value of 2.

4. The computer-accessible medium of claim 1, wherein the echoes include at least two successive echoes which are used to generate at least one of the images.

5. The computer-accessible medium of claim 4, wherein the at least one of the images is generated by an odd echo and an even echo acquiring outer and inner halves of k-space, respectively.

6. The computer-accessible medium of claim 1, wherein the turbo factor has a value of 4.

7. The computer-accessible medium of claim 1, wherein the computing arrangement is further configured to obtain the data in a breathhold.

8. The computer-accessible medium of claim 7, wherein the data pertains to at least one FSE pulse sequence of at least one of liver, heart, pancreas, or anterior pituitary.

9. The computer-accessible medium of claim 1, wherein the computing arrangement is further configured to determine at least one of proton transverse relaxation rates or proton transverse relaxation times for generating at least one of the images.

10. The computer-accessible medium of claim 1, wherein the data pertains to at least one FSE pulse sequence of at least two of liver, heart, pancreas, or brain.

11. The computer-accessible medium of claim 1, wherein the computing arrangement is further configured to perform a quantitative assessment of iron deposition in the at least one anatomical structure from the data.

12. The computer-accessible medium of claim 9, wherein the quantitative assessment is regarding at least one of hepatic iron deposition, myocardial iron deposition, or brain iron deposition.

13. The computer-accessible medium of claim 1, wherein the computing arrangement is further configured to perform a quantitative assessment of edema in at least one anatomical structure using the data.

14. The computer-accessible medium of claim 11, wherein the quantitative assessment is regarding at least one of acute myocardial infarction, myocarditis, cardiac transplant rejection, or cartilage injury.

15. A method for generating multiple images associated with at least one anatomical structure using magnetic resonance imaging (MRI) data, comprising:
    obtaining the data based on at least one multi-echo fast spin-echo (FSE) pulse sequence; and
    with a computing arrangement, generating each of the images based on the data using a reverse centric k-space reordering procedure and employing a turbo factor having an even value.

16. The method of claim 15, wherein the data includes hardware specifications of a MRI system.

17. The method of claim 15, wherein the turbo factor has a value of 2.

18. The method of claim 15, wherein the echoes include at least two successive echoes which are used to generate at least one of the images, and wherein the at least one of the images is generated by an odd echo and an even echo acquiring outer and inner halves of k-space, respectively.

19. The method of claim 15, further comprising determining at least one of proton transverse relaxation rates or proton transverse relaxation times for generating at least one of the images.

20. The method of claim 15, further comprising at least one of displaying or storing at least one of (i) information associated with at least one of the images, or (ii) at least one of the proton transverse relaxation rates or the proton transverse relaxation times for generating the at least one image in a storage arrangement in at least one of a user-accessible format or a user-readable format.

21. A system for generating multiple images associated with at least one anatomical structure using magnetic resonance imaging (MRI) data, comprising:
    a non-transitory computer-accessible medium having executable instructions thereon, wherein when at least one computing arrangement executes the instructions, the at least one computing arrangement is configured to:
        obtain data based on at least one multi-echo fast spin-echo (FSE) pulse sequence; and
        generate each of the images based on the data using a reverse centric k-space reordering procedure and employing a turbo factor having an even value.

22. The system of claim 21, wherein the data includes hardware specifications of a MRI system.

23. The system of claim 21, wherein the echoes include at least two successive echoes which are used to generate at least one of the images, wherein the at least one of the images is generated by an odd echo and an even echo acquiring outer and inner halves of k-space, respectively, and wherein the turbo factor has a value of at least one of 2 or 4.

24. The system of claim 21, wherein the computing arrangement is further configured to determine at least one of proton transverse relaxation rates or proton transverse relaxation times for generating at least one of the images.

* * * * *